(12) United States Patent
Fornara

(10) Patent No.: US 9,874,856 B2
(45) Date of Patent: Jan. 23, 2018

(54) EEPROM CELL WITH CHARGE LOSS

(71) Applicant: STMicroelectronics (Rousset) SAS, Rousset (FR)

(72) Inventor: Pascal Fornara, Pourrières (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 14/883,364

(22) Filed: Oct. 14, 2015

(65) Prior Publication Data

US 2016/0033937 A1 Feb. 4, 2016

Related U.S. Application Data

(62) Division of application No. 12/812,533, filed as application No. PCT/FR2008/052437 on Dec. 31, 2008, now Pat. No. 9,165,775.

(30) Foreign Application Priority Data

Jan. 11, 2008 (FR) ...................... 08 50170

(51) Int. Cl.
| | | |
|---|---|---|
| *G11C 16/04* | (2006.01) | |
| *H01L 27/115* | (2017.01) | |
| *G04F 10/10* | (2006.01) | |
| *G11C 16/28* | (2006.01) | |
| *G11C 16/34* | (2006.01) | |
| *G11C 27/00* | (2006.01) | |

(Continued)

(52) U.S. Cl.
CPC .......... *G04F 10/10* (2013.01); *G11C 16/0433* (2013.01); *G11C 16/0441* (2013.01); *G11C 16/28* (2013.01); *G11C 16/349* (2013.01); *G11C 27/005* (2013.01); *H01L 21/28273* (2013.01); *H01L 27/115* (2013.01); *H01L 27/11521* (2013.01); *H01L 27/11524* (2013.01); *H01L 29/511* (2013.01); *H01L 29/518* (2013.01); *H01L 29/66825* (2013.01); *H01L 29/788* (2013.01)

(58) Field of Classification Search
CPC ......... H01L 27/11517; H01L 27/11521; H01L 27/11524; H01L 29/788; H01L 29/7883; G11C 16/0408; G11C 16/0433
See application file for complete search history.

(56) References Cited

U.S. PATENT DOCUMENTS

| | | | | |
|---|---|---|---|---|
| 5,648,669 A | * | 7/1997 | Sethi | ................... G11C 16/0441 257/318 |
| 6,229,175 B1 | | 5/2001 | Uchida | |

(Continued)

FOREIGN PATENT DOCUMENTS

| | | |
|---|---|---|
| WO | 01/17025 A2 | 3/2001 |
| WO | 03/083769 A1 | 10/2003 |

OTHER PUBLICATIONS

International Search Report issued in international application No. PCT/FR2008/052437, dated Jun. 19, 2009, 4 pages.

*Primary Examiner* — Allison P Bernstein
(74) *Attorney, Agent, or Firm* — Seed IP Law Group LLP

(57) ABSTRACT

An EEPROM memory cell includes a dual-gate MOS transistor in which the two gates are separated by an insulation layer. The insulation layer includes a first portion and a second portion having lower insulation properties than the first one. The second portion is located at least partially above a channel region of the transistor.

19 Claims, 11 Drawing Sheets

(51) Int. Cl.
*H01L 21/28* (2006.01)
*H01L 27/11521* (2017.01)
*H01L 27/11524* (2017.01)
*H01L 29/66* (2006.01)
*H01L 29/788* (2006.01)
*H01L 29/51* (2006.01)

(56) References Cited

U.S. PATENT DOCUMENTS

| | | |
|---|---|---|
| 6,856,581 B1 | 2/2005 | Berstis et al. |
| 6,869,844 B1 | 3/2005 | Liu et al. |
| 6,897,689 B2 * | 5/2005 | La Rosa .............. H03K 17/223 327/143 |
| 8,036,020 B2 | 10/2011 | La Rosa |
| 8,320,176 B2 | 11/2012 | La Rosa |
| 8,331,203 B2 | 12/2012 | La Rosa |
| 8,339,848 B2 | 12/2012 | La Rosa |
| 2004/0032244 A1 | 2/2004 | Palm et al. |
| 2004/0256658 A1 | 12/2004 | Park et al. |
| 2006/0244434 A1 | 11/2006 | Watanabe et al. |
| 2006/0273374 A1 | 12/2006 | Kobayashi et al. |

* cited by examiner

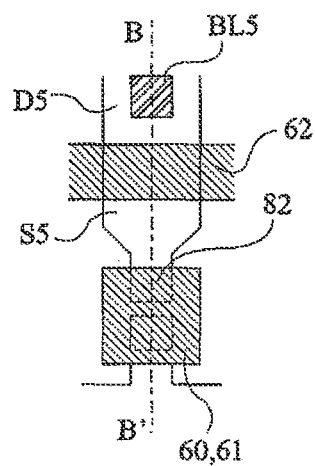
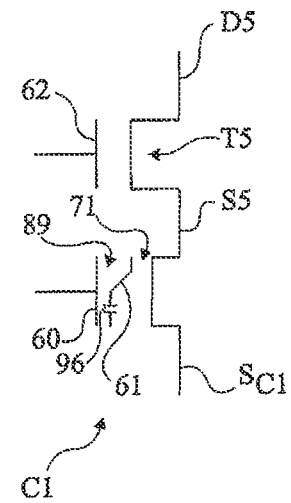
Fig 9A
Fig 9C
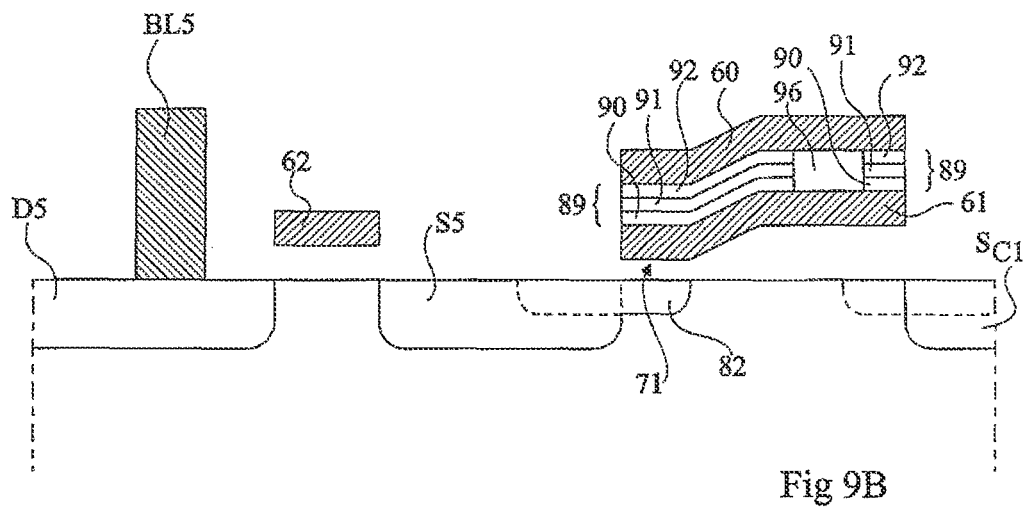
Fig 9B

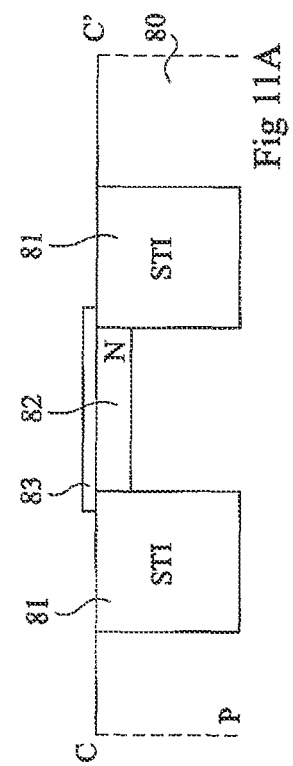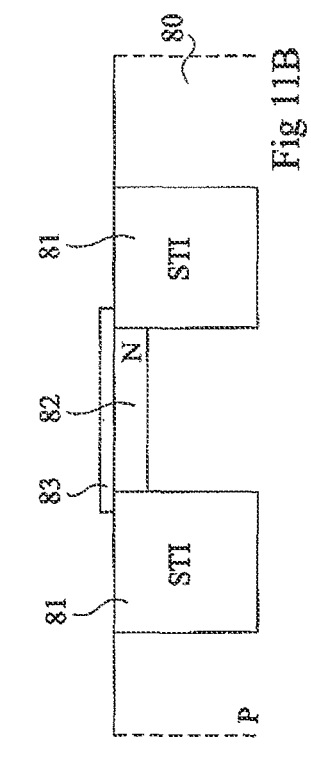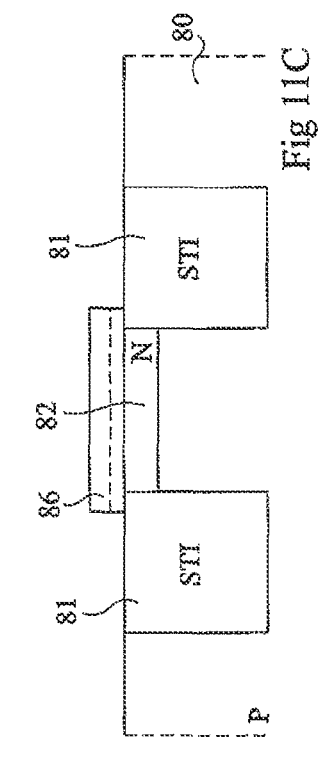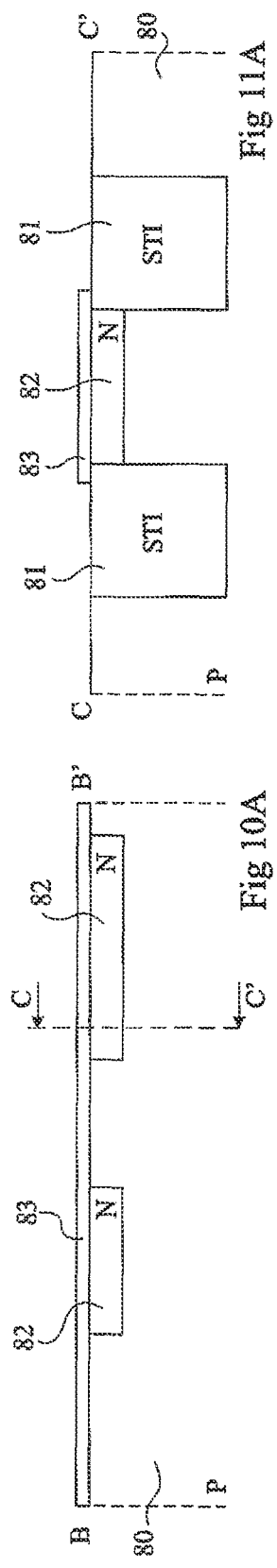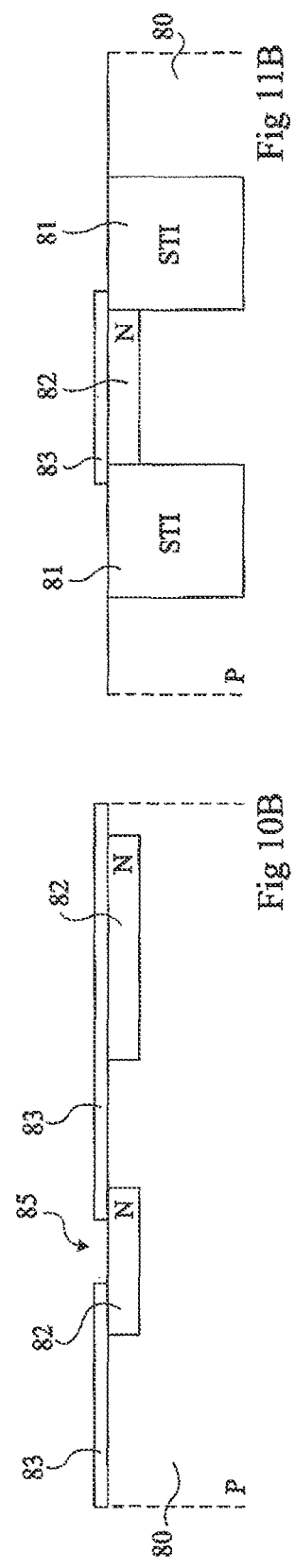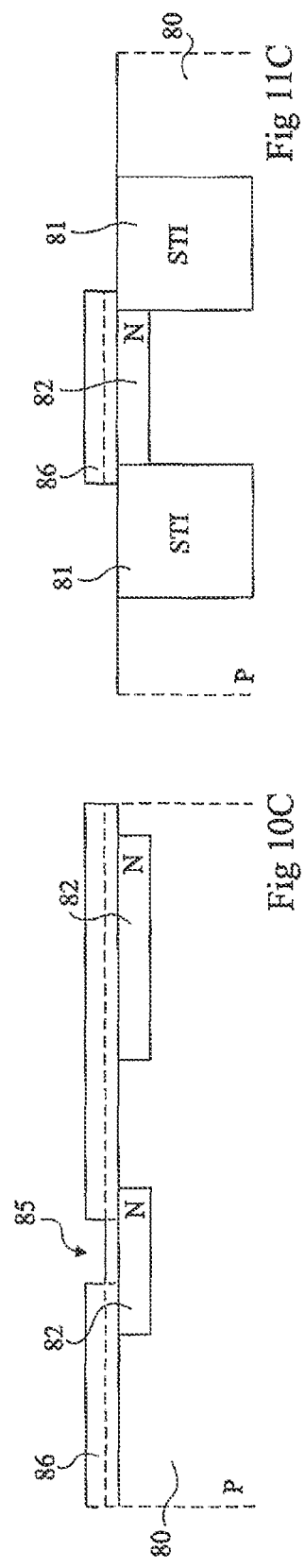

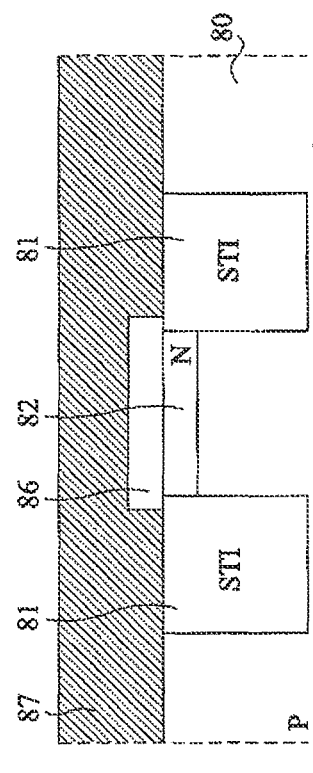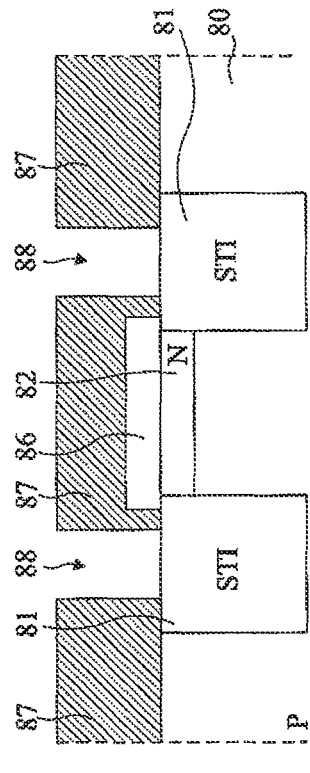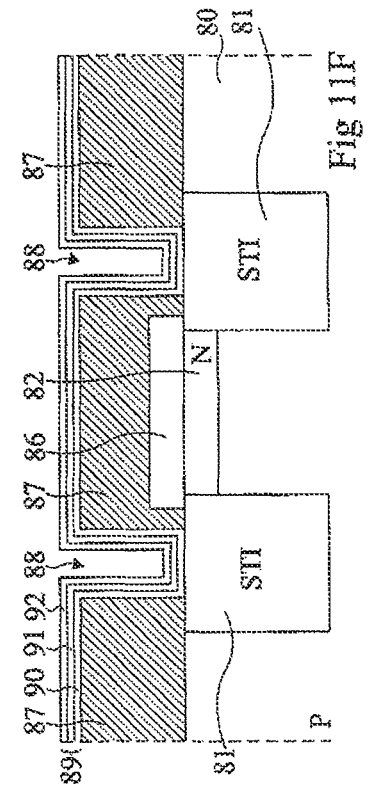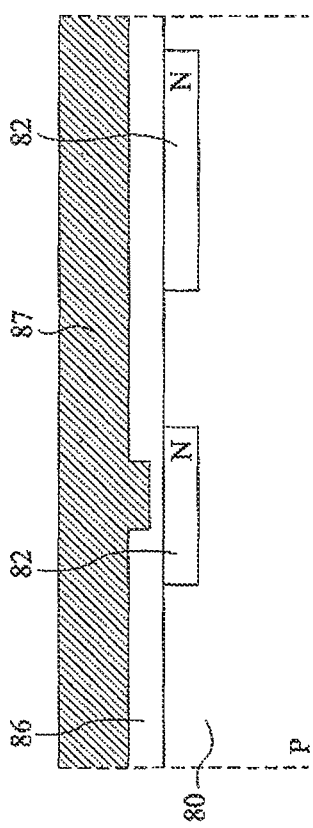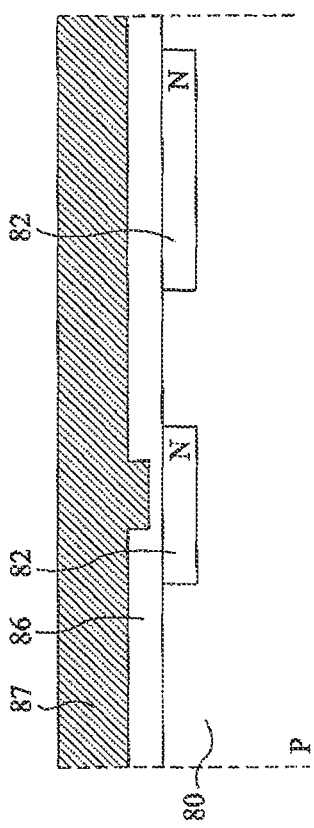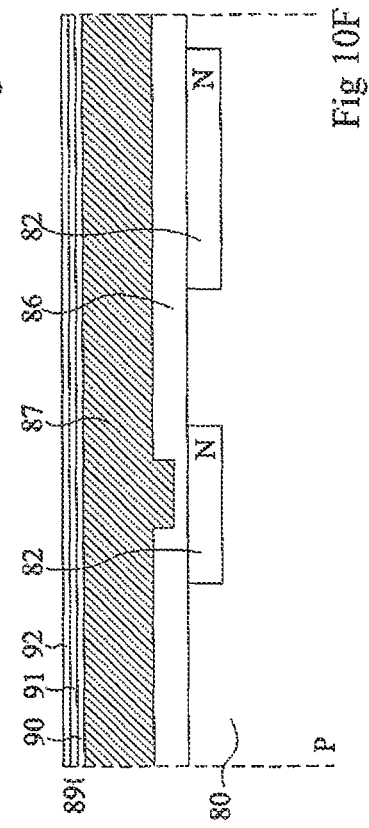

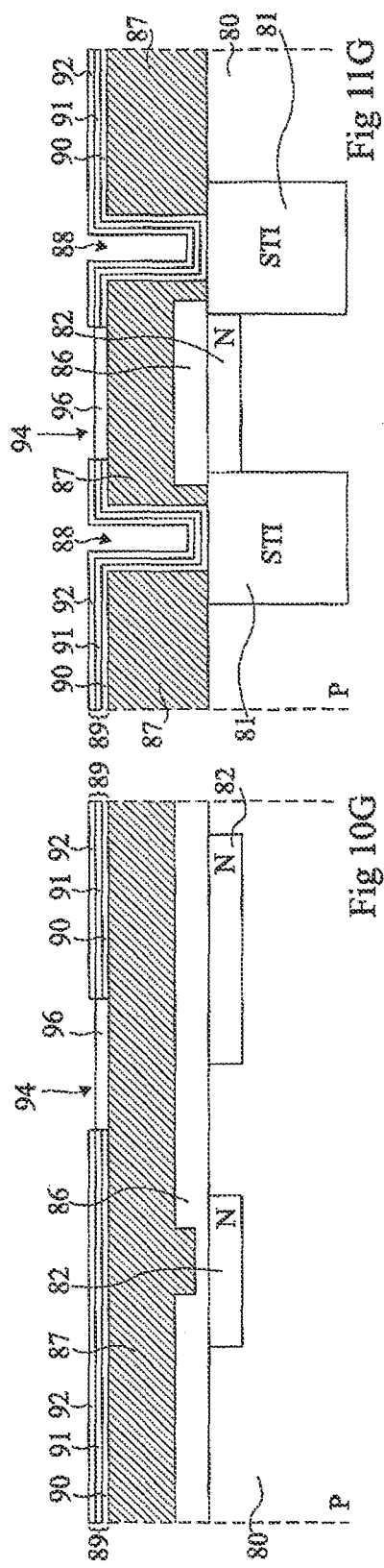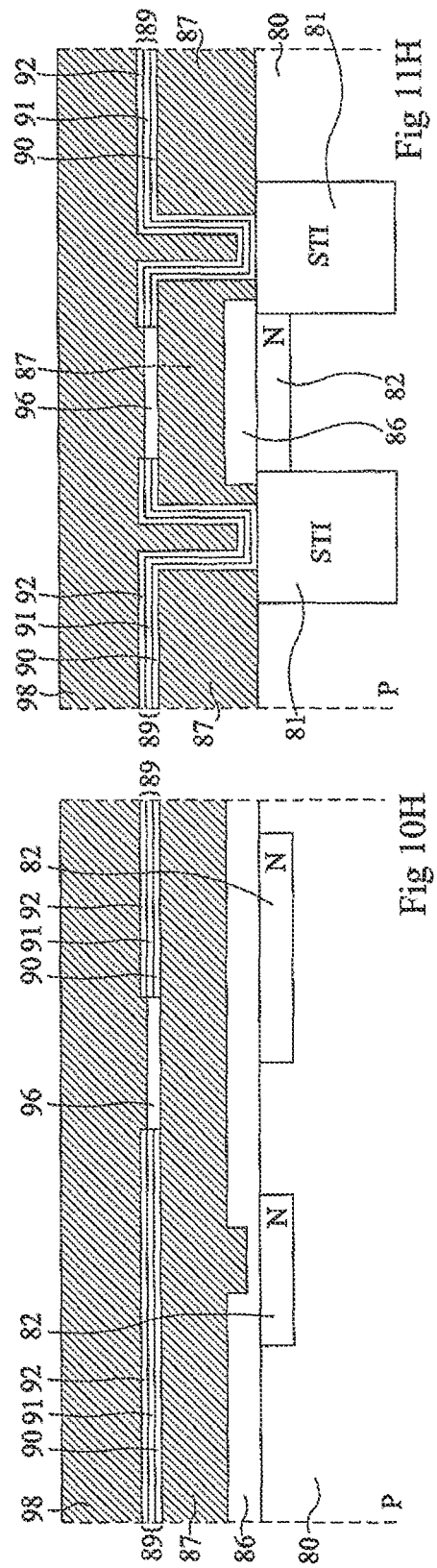

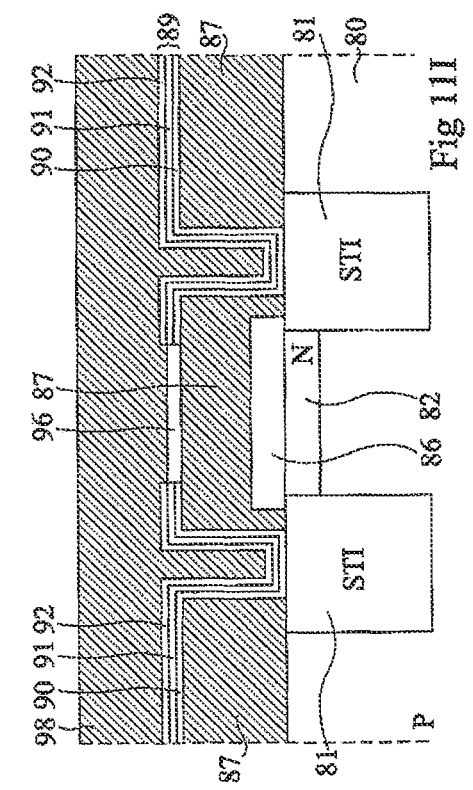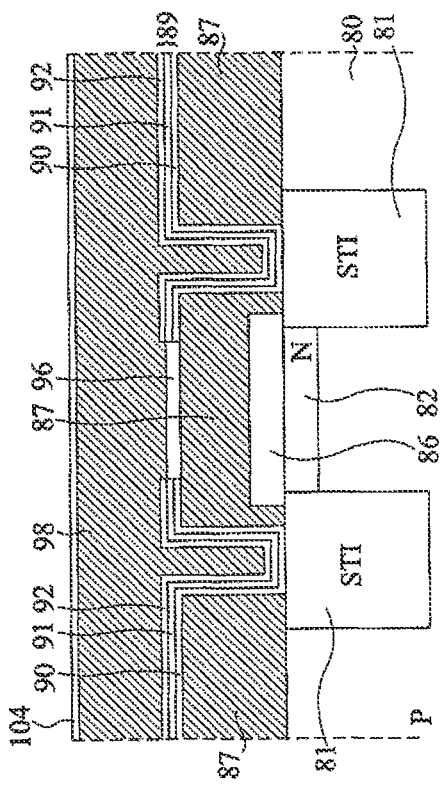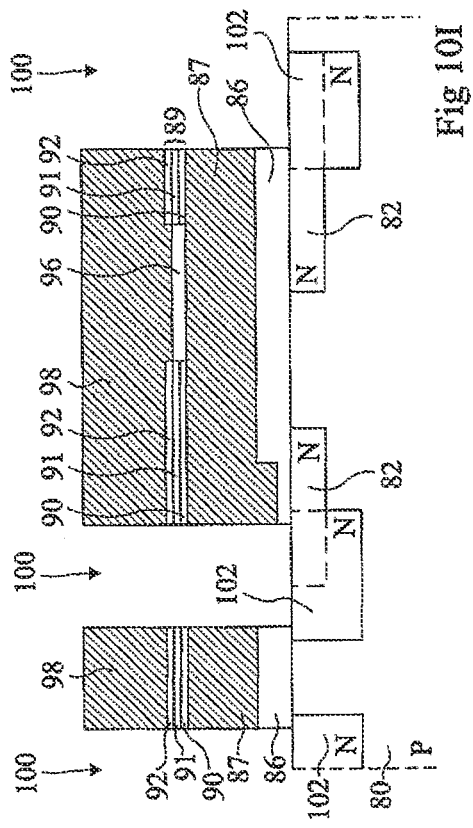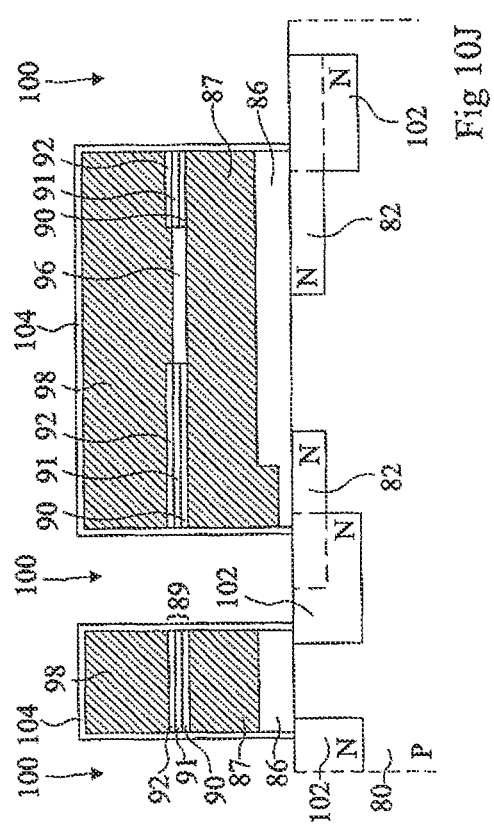

EEPROM CELL WITH CHARGE LOSS

CROSS REFERENCE TO RELATED APPLICATIONS

This application is a division of U.S. application Ser. No. 12/812,533, filed Dec. 2, 2011, which is a U.S. National Stage patent application based on PCT application number PCT/FR2008/052437, entitled "EEPROM cell with Charge Loss", filed on Dec. 31, 2008 which application claims the priority benefit of French patent application number 08/50170, filed on Jan. 11, 2008, entitled "EEPROM cell with Charge Loss," which applications are hereby incorporated by reference to the maximum extent allowable by law.

BACKGROUND OF THE INVENTION

Field of the Invention

The present invention generally relates to electronic circuits and, more specifically, to the forming of a circuit enabling controllably holding electric charges for a time measurement.

Discussion of the Related Art

In many applications, it is desired to have information representative of the time elapsed between two events, be it an accurate or approximate measurement. An example of application relates to the time management of rights of access, especially to media.

The obtaining of this information representative of the elapsed time usually requires a time measurement by an electronic circuit powered, for example, by means of a battery, to avoid losing the information when the circuit is not used.

It would be desirable to have a time measurement which operates even when the electronic measurement circuit is not powered.

International patent application WO-A-03/083769 describes a transactional electronic entity secured by time measurement, in which the time elapsed between two successive transactions is determined by measuring the charge of a capacitive component exhibiting a leakage of its spacer. The component is charged when the circuit is powered and its residual charge, after an interruption of the power supply, is measured when the circuit is powered again. This residual charge is considered as representative of the time elapsed between the two circuit powering times.

The electronic entity is based on a MOS transistor having its gate connected to a first electrode of a capacitive component having its other electrode grounded with the transistor source. The transistor drain is connected to a power supply voltage by means of a current-to-voltage conversion resistor. The voltage measured across the resistor is a function of the drain current in the transistor, and thus of the gate-source voltage thereof, and thus of the voltage across the capacitive component. A time interval is initialized by charging the capacitive component by application of an electric power source on its electrode common with the transistor gate.

The solution provided by this document has several disadvantages.

First, the measurable time range is limited by the possibilities of intervention on the dielectric of the capacitive element.

Then, the charge of the capacitive component generates electric stress on its dielectric so that measurements drift along time.

Further, the provided structure requires forming of a specific component. In certain applications, it would be desirable to associate the time measurement element with a memory to condition the access to the data or programs contained in this memory. The solution of the above-mentioned document is hardly compatible with memory manufacturing steps.

Further, the interpretation of the residual charge in the capacitive component requires calibration steps to generate charge-to-time conversion tables.

SUMMARY OF THE INVENTION

An embodiment aims at overcoming all or part of the disadvantages of known solutions to provide information representative of the time elapsed between two events, without it being necessary to permanently power the electronic circuit containing the means to achieve this.

An embodiment aims at a charge retention electronic circuit for a time measurement.

An embodiment aims at the forming of such a circuit compatible with technologies used in the forming of memory cells.

An embodiment aims at a method for forming an EEPROM cell with a controllable charge loss.

To achieve all or part of these objects, as well as others, at least one embodiment of the present invention provides an EEPROM cell comprising a dual-gate MOS transistor having its two gates separated by an insulating layer, the insulating layer being formed of a first portion and of a second portion less insulating than the first portion, the second portion being located, at least partly, above a channel region of the transistor.

According to an embodiment, the first portion of the insulating layer is formed of a stack of a first silicon oxide layer, of a silicon nitride layer, and of a second silicon oxide layer, the second portion of the insulating layer being formed of a third silicon oxide layer.

An embodiment provides an electronic charge retention circuit for a time measurement, implanted in a network of EEPROM-type cells each comprising a selection transistor in series with a dual-gate transistor comprising, on a same row of memory cells: a first subset formed of at least one cell such as defined previously; and a second subset of at least one second cell having the tunnel window of its dual-gate transistor eliminated, the floating gates of the dual-gate transistors of the cells of the two subsets being connected to a floating node.

According to an embodiment, the circuit further comprises a third subset of at least one third cell, the floating gate of the dual-gate transistor of the third cell being connected to the floating node, the third subset being used to inject or extract charges into or from the floating node in a programming or reset phase.

According to an embodiment, the measurement of time information is obtained by evaluating the residual charge of the floating node based on the current in the dual-gate transistor of the second subset.

An embodiment provides a method for forming an EEPROM cell comprising a dual-gate polysilicon transistor, and comprising, after a step of forming of a first gate and before a step of forming of a second gate, the successive steps of: forming, on the first gate, a first layer of an insulating material; forming, in the first insulating material layer, an opening; forming, in the opening and on the first gate, a second insulating material layer, the second layer being less insulating than the first insulating layer.

According to an embodiment, the first insulating material layer is formed of a stack of a first silicon oxide layer, of a silicon nitride layer, and of a second silicon oxide layer, and the second insulating material layer is formed of a third silicon oxide layer.

BRIEF DESCRIPTION OF THE DRAWINGS

The foregoing and other objects, features, and advantages of the present invention will be discussed in detail in the following non-limiting description of specific embodiments in connection with the accompanying drawings, among which:

FIGS. 9A, 9B, and 9C respectively are a top view, a cross-section view, and the equivalent electric diagram of a third element of the circuit of FIG. 6;

FIGS. 10A to 10J and 11A to 11J illustrate, respectively in cross-section view along a first and a second direction, results of steps of a method for manufacturing the structure of FIGS. 9A to 9C;

Figure 1:
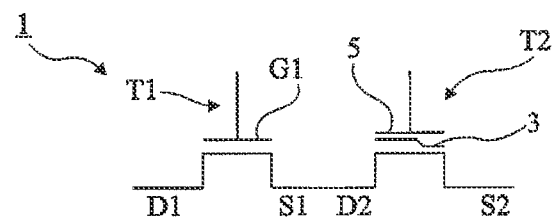
FIG. 1 is an electric diagram of an EEPROM cell.

The same elements have been designated with the same reference numerals in the different drawings, which have been drawn out of scale. For clarity, only those elements and steps which are useful to the understanding of the present invention have been shown and will be described. In particular, what use is made of the obtained time information has not been detailed, the present invention being compatible with any usual exploitation of such time information. Similarly, the methods and elements causing such a programming or initialization of a time countdown have not been detailed, the present invention being here again compatible with any need to trigger a time countdown.

DETAILED DESCRIPTION

FIG. 1 is an electric diagram of a memory cell 1 forming EEPROMs. Memory cell 1 is formed of a read transistor T1 and of a memory point T2. Transistor T1 is a MOS transistor comprising a drain D1, a source S1, and an insulated gate G1. Memory point T2 is of dual-gate type. It comprises a drain D2, a source S2, and two insulated gates, that is, a floating gate 3 and a control gate 5. A memory point T2 having its floating gate insulator comprising at least a portion which is sufficiently thin to enable passing, by tunnel effect, of carriers between the underlying channel and the floating gate is then considered. The floating gate insulator 3 is called "tunnel insulator" or "tunnel oxide". Source S1 of transistor T1 is connected to drain D2 of memory point T2.

Figure 2A:
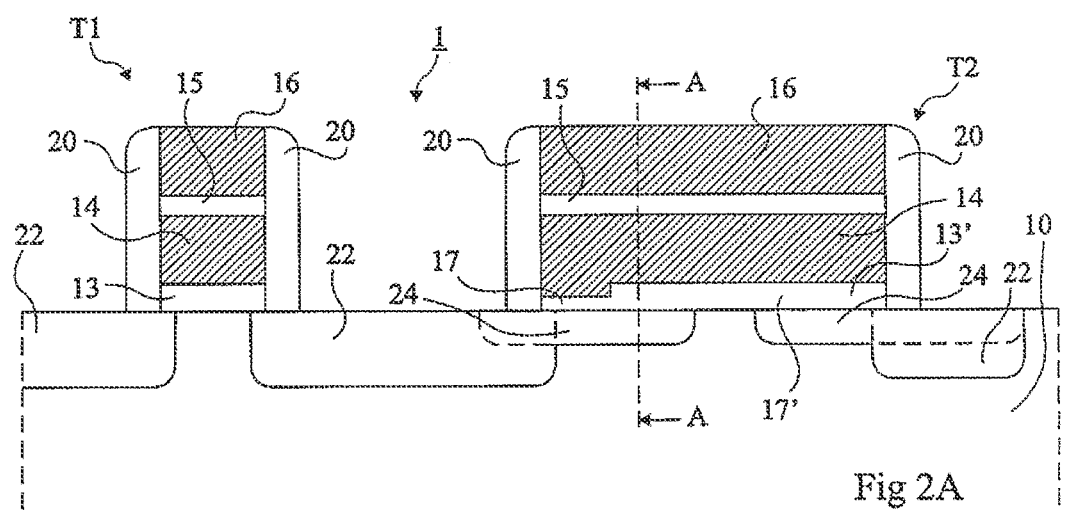
FIGS. 2A and 2B illustrate, along two perpendicular cross-section planes, the structure of the cell of FIG. 1.
Figure 2B:
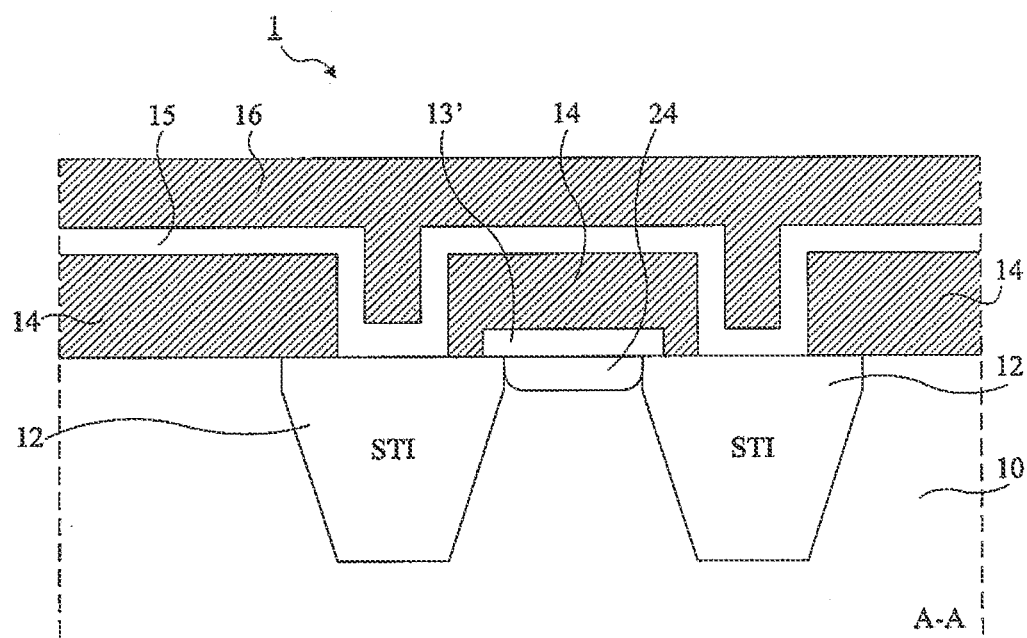

FIGS. 2A and 2B illustrate, along two perpendicular cross-section planes, the structure of a memory cell 1 of the type of that in FIG. 1.

Cell 1 is formed in an active region of a semiconductor substrate 10, typically single-crystal silicon, laterally delimited by field insulation areas 12 (STI, FIG. 2B).

Above semiconductor substrate 10 are formed the gate structures of transistor T1 and of memory point T2. The gate of transistor T1 is formed of a stack of a first insulating portion 13, of a first conductive portion 14, of a second insulating portion 15, and of a second conductive portion 16. It may be desirable for the operation of transistor T1 to be similar to that of a conventional single-gate MOS transistor. For this purpose, an opening may be provided in insulating portion 15 so that portions 14 and 16 are short-circuited. The gate of memory point T2 is formed of a stack 13'-14-15-16 having portions 14, 15, and 16 similar to those of transistor T1. Conductive layer 14 forms the floating gate of memory point T2 and conductive layer 16 forms the control gate of this memory point. Insulating portion 13' comprises a relatively thick portion 17' forming the non-tunnel portion of the insulator of floating gate 14 and a relatively thin portion 17 forming the tunnel oxide portion. Oxide portion 17, thinner than portion 17', extends across the entire width of the active area to reach the area above field insulation areas 12. Spacers 20 are formed on either side of transistor T1 and of memory point T2.

Conductive layers 14 and 16 are, for example, made of polysilicon of a thickness, respectively, of approximately 100 nm and approximately 200 nm and insulating portions 17 and 17' are made of oxide, for example, of silicon oxide ($SiO_2$). Insulating layer 14 is typically formed of an oxide-nitride-oxide stack ("ONO" stack) of a total thickness of approximately 180 nm. As an example, in the ONO stack, the oxide may be silicon oxide and the nitride may be silicon nitride.

On either side of transistor T1 and of memory point T2, areas 22 of implantation of the drain and source of transistor T1 and of the drain and source of memory point T2 are formed in silicon substrate 10 (the source region of transistor T1 and the drain region of memory point T2 join). Two other implantation areas 24 are formed on either side of memory point T2 at the surface of substrate 10, partly under insulating portion 13'.

Figure 3:
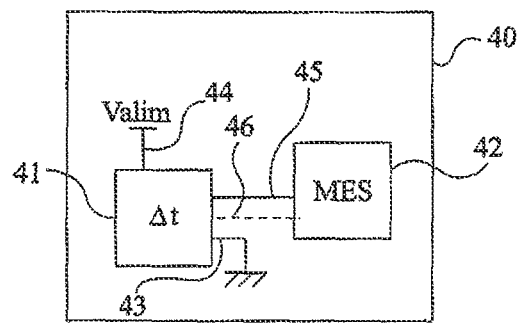
FIG. 3 very schematically shows in the form of blocks an electronic entity equipped with a charge retention circuit according to an embodiment.

FIG. 3 very schematically shows in the form of blocks an electronic device 40 comprising an electronic charge retention circuit 41.

Device 40 is any electric device capable of exploiting information representative of the time elapsed between two events. It is equipped with a controllable charge retention circuit 41 ($\Delta t$) for a time measurement. Circuit 41 can be submitted to a supply voltage Valim applied between two terminals 43 and 44, terminal 43 being connected to a reference voltage (for example, the ground). Voltage Valim is used to initialize a charge retention phase. Two terminals 45 and 46 of circuit 41 are intended to be connected to a measurement circuit 42 (MES) capable of transforming information about a residual charge of an element of circuit 41 into information relative to the time elapsed between the initialization time of the retention phase and the measurement time. Terminal 46 may be used as a reference for the measurement and be grounded. Circuit 41 is preferentially integrated from a semiconductor substrate, for example, silicon.

Figure 4:
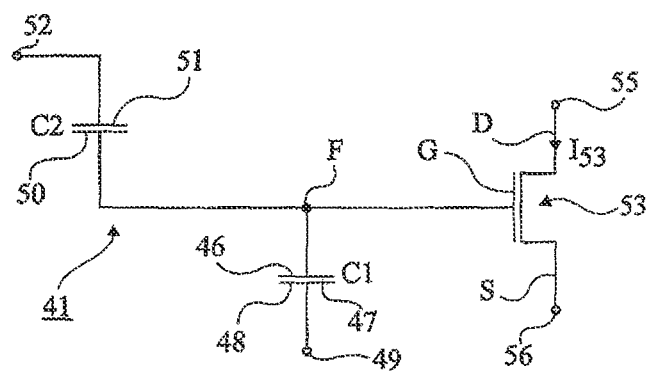
FIG. 4 is a functional diagram of an embodiment of an electronic charge retention circuit.

FIG. 4 shows an embodiment of an electronic charge retention circuit 41.

Circuit 41 comprises a first capacitive element C1 having a first electrode 46 connected to a floating node F and having its spacer 47 designed to have non-negligible leakages along time. Floating node F is used to designate a node not directly connected to any diffused region of the semiconductor substrate and, more specifically, separated, by a spacer, from all voltage-application terminals. Second electrode 48 of capacitive element C1 is connected to a terminal 49 which is connected to a reference voltage or is left floating.

Preferably, a second capacitive element C2 has a first electrode 50 connected to node F and a second electrode 51 connected to a terminal 52 of the circuit intended to be connected to a power source (for example, voltage Valim) on initialization of a charge retention phase.

Capacitive element C1 has the function of storing an electric charge, then of relatively slowly discharging due to the leakage through its spacer. Capacitive element C2 has the function of enabling the injection of charges into capacitive element C1 by Fowler-Nordheim effect or by a hot electron injection phenomenon. Element C2 enables avoiding the stress on element C1 on charge thereof.

Node F is connected to a gate G of a transistor with an insulated-gate terminal (for example, a MOS transistor 53) having its conduction terminals (drain D and source S) connected, respectively, to output terminals 55 and 56 to measure the residual charge contained in element C1. For example, terminal 56 is grounded and terminal 55 is connected to a current source enabling current-to-voltage conversion of drain current $I_{53}$ in transistor 53.

Figure 5:
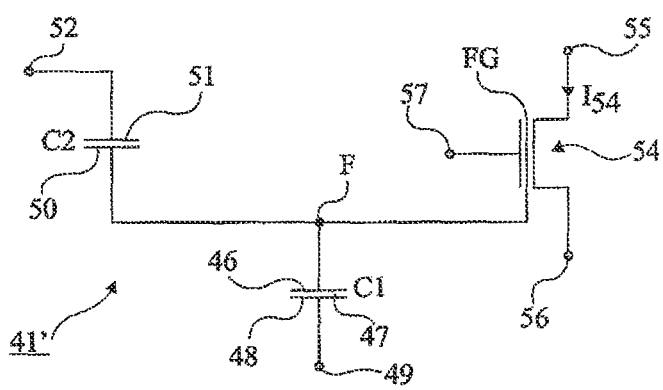
FIG. 5 is a functional diagram of another embodiment of an electronic charge retention circuit.

FIG. 5 shows another embodiment of a controllable charge retention circuit 41'. As compared with the embodiment of FIG. 4, transistor 53 is replaced with a dual-gate transistor 54 having its floating gate FG connected to node F. The control gate of transistor 54 is connected to a terminal 57 for controlling the reading of the residual charge from the circuit. As in the circuit of FIG. 4, terminal 56 may be grounded and terminal 55 may be connected to a current source enabling current-to-voltage conversion of drain current $I_{54}$ in transistor 54.

The evaluation of drain current $I_{54}$, representative of the voltage across capacitive element C1, may be performed by maintaining terminals 49 and 56 at the same voltage (for example, the ground) and by applying a D.C. voltage on terminal 55. Different reference voltages may also be applied on terminals 49 and 56, as will be seen hereafter.

The time interval between the time when voltage Valim stops being applied on terminal 52 and the time when the charge at node F cancels depends not only on the leakage capacitance of the dielectric of element C1, but also on its storage capacity, which conditions the charge present at node F when Valim stops being applied on terminal 52. It is thus possible to define a correlation between the residual charge (with respect to the initial charge) and the time elapsed after a circuit reset phase.

Assuming that terminals 49 and 56 are at reference voltages and that terminal 55 is biased to a determined level so that a current variation $I_{54}$ only results from a variation of the voltage at node F, this variation then only depends on the time elapsed since a time during which the power supply is stopped on terminal 52.

After, an extraction of electrons (application on terminal 52 of a positive reset voltage with respect to terminal 49) by Fowler-Nordheim effect is assumed, but the operation which will be described easily transposes to an injection of electrons at node F, for example, by a so-called hot carrier phenomenon.

Any circuit for reading the voltage of node F may be contemplated. For example, the measured value of the current in transistor 54 or of a voltage representative of this current may be converted into time by means of a conversion table or, after digitization, based on a conversion rule established from a characterization of the circuit. Preferred examples of read circuits for interpreting the time discharge and of their operation will be described in relation with FIGS. 12 to 19.

Although reference has been made to a single supply voltage Valim, different voltages may be used in programming and in reading, provided to have an exploitable reference value between the residual charge and the measurement.

Figure 6:
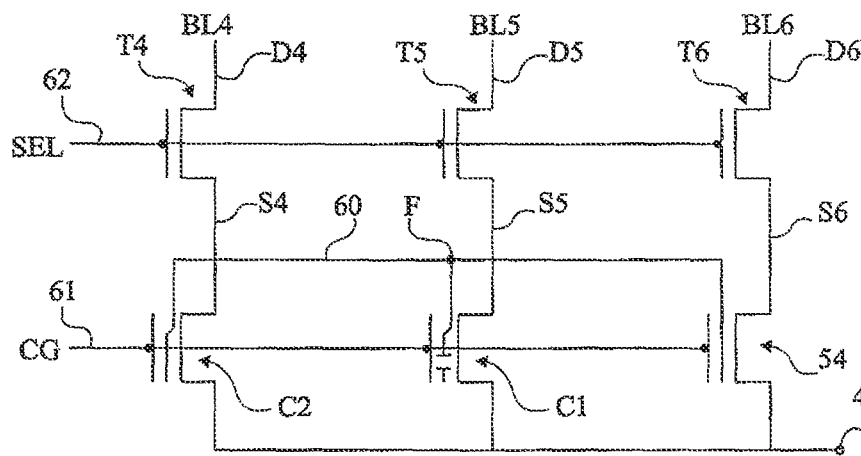
FIG. 6 is an electric diagram of an embodiment of an electronic charge retention circuit.

FIG. 6 shows an embodiment of a circuit such as that in FIG. 5 in an integrated structure derived from an EEPROM architecture.

Each element or cell C2, C1, or 54 is obtained from a floating gate transistor series-connected with a selection transistor T4, T5, or T6 to select, for example, from an array network of EEPROM cells, the electronic charge retention circuit.

The floating gates of the different transistors forming elements C2, C1, and 54 are interconnected (conductive line 60) to form floating node F. Their control gates are connected together to a conductive line 61 of application of a read control signal CG. Their respective sources are interconnected to terminal 49 (the ground) and their respective drains are connected to the respective sources of selection transistors T4, T5, and T6.

The gates of transistors T4 to T6 are connected together to a conductive line 62 of application of a circuit selection signal SEL. Their respective drains D4, D5, and D6 are connected to individually-controllable bit lines BL4, BL5, and BL6. The order of the bit lines in FIG. 6 has been arbitrarily illustrated as BL4, BL5, BL6, but the order of the different elements C2, C1, and 54 in the horizontal row direction (in the orientation of the drawings) is indifferent.

Figure 7A:
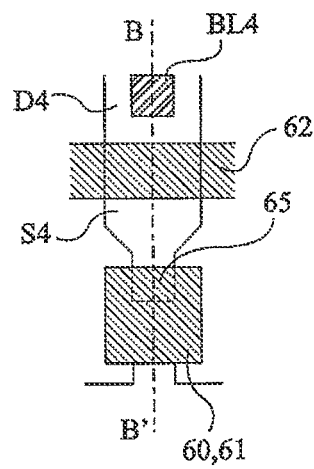
FIGS. 7A, 7B, and 7C respectively are a top view, a cross-section view, and the equivalent electric diagram of a first element of the circuit of FIG. 6.
Figure 7B:
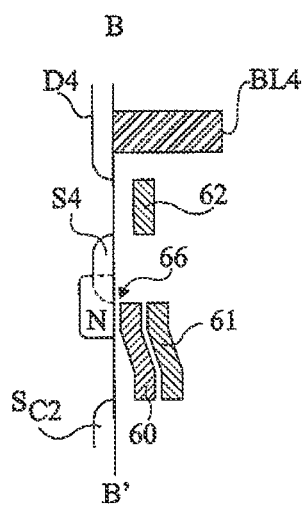
Figure 7C:
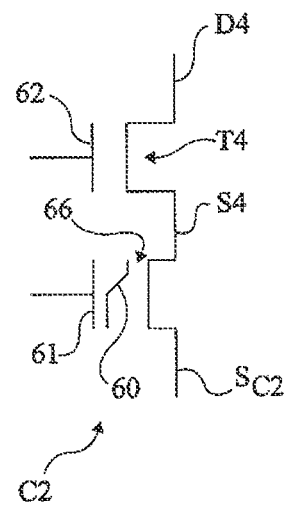
Figure 8A:
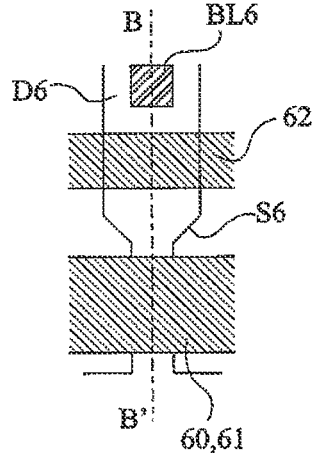
FIGS. 8A, 8B, and 8C respectively are a top view, a cross-section view, and the equivalent electric diagram of a second element of the circuit of FIG. 6.
Figure 8B:
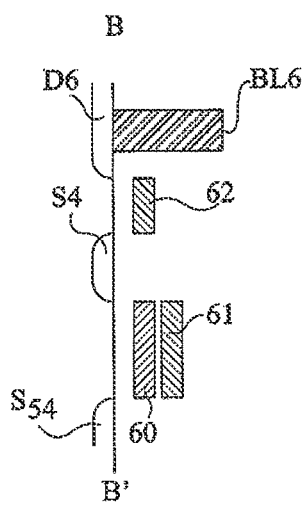
Figure 8C:
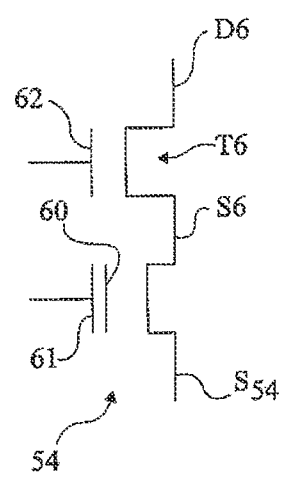

FIGS. 7A, 8A, and 9A are simplified top views, respectively of element C2, of element 54, and of element C1. FIGS. 7B, 8B, and 9B respectively are cross-section views along a line B-B' of FIGS. 7A, 8A, and 9A. FIGS. 7C, 8C, and 9C show the respective equivalent electric diagrams of elements C2, 54, and C1.

In the described example, an embodiment with an N-channel transistor in a P-type silicon substrate is assumed. The opposite is of course possible.

In this embodiment, N-type source and drain regions separated from one another in the line direction by insulating areas are assumed. The floating gates are formed in a first conductive level separated from the active regions by an insulating level and the control gates are formed in a second conductive level separated from the first conductive by a second insulating level.

A difference with a usual EPROM cell network is that the floating gates are interconnected by groups of three transistors to form floating node F. Another difference is that the floating gate transistors forming the different circuit elements differ from one another in the drain and source connection.

FIGS. 7A to 7C illustrate the forming of programming capacitive element C2. It is a standard EEPROM cell with an extension 65 of the N doped area under tunnel window 66 (FIG. 7B) which enables obtaining a plateau in the charge injection area. As for a standard EEPROM cell, the drain area of element C2 is connected to source S4 of selection transistor T4. Source area $S_{C2}$ of element C2 is connected to terminal 49 (FIG. 6).

FIGS. 8A, 8B, and 8C illustrate the forming of read transistor 54 in which the tunnel window as well as, preferably, the usual implanted area (65, FIG. 7B) of an EEPROM cell have been eliminated. The active area of element 54, limited by its source $S_{54}$ and its drain S6, is thus similar to that of a normal MOS transistor.

FIGS. 9A, 9B, and 9C illustrate the forming of capacitive element C1 forming both the charge retention element and the leakage element of the charge retention circuit. It is a standard EEPROM cell with an extension 82 of the N doped area under tunnel window 71 (FIG. 9B) which enables obtaining a plateau in the charge injection area. Further, the drain area of element C1 is connected to source S5 of selection transistor T5. Source area $S_{C1}$ of element C1 is connected to terminal 49 (FIG. 6). As compared with a standard EEPROM cell, a difference is to modify the insulating layer located between floating gate 61 and control gate 60. This insulating layer is formed of a portion 89 of an insulating material identical to standard EEPROM cells and of a portion 96, located, for practical reasons relating to the relative dimensions, at least partly above the transistor channel region, less insulating than portion 89. For example, portion 89 may be formed of an ONO stack and portion 96 may be formed of a simple oxide layer, for example, silicon oxide.

The presence of portion 96, less insulating than the insulator usually used between the two gates of an EEPROM point, enables leakage of charges stored in floating gate 61. The dimensions of portion 96 then define the discharge speed of floating gate 61. Thus, a time measurement is easily implementable, once the dimensions of portion 96 (and thus the discharge speed of floating gate 61) have been properly specified, by means of a circuit for measuring the residual charge in floating gate 61.

The representations of FIGS. 7A to 9C are simplified and may be adapted to the used technology. In particular, the gates have been shown as aligned with the limits of the drain and source areas, but a slight overlap is often present.

An advantage of the embodiment by means of an EEPROM cell technology is that the charge retention circuit may be programmed and reset by applying the same voltage levels and the same time windows as those used to erase or write into the EEPROM cells.

The respective connections of bit lines BL4 to BL6 depend on the circuit operating phases and especially on the programming (reset) or read phase.

Table I hereafter illustrates an embodiment of a reset (SET) of and of a reading (READ) from an electronic charge retention circuit such as illustrated in FIGS. 6 to 9C.

TABLE I

|  | SEL | CG | BL4 | BL5 | BL6 | 49 |
|---|---|---|---|---|---|---|
| SET | $V_{PP1}$ | 0 | $V_{PP2}$ | HZ | HZ | HZ |
| READ | $V_{SEL}$ | $V_{READ}$ | HZ | HZ | $V_{55}$ | 0 |

In a reset phase SET, selection signal SEL is brought to a first high voltage $V_{PP1}$ with respect to ground to turn on the different transistors T4 to T6 while signal CG, applied on the control gates of the floating gate transistors, remains at low level 0 to avoid turning on transistor 54. Bit lines BL5 and BL6 remain floating (high impedance state HZ) while a positive voltage $V_{PP2}$ is applied on line BL4 to enable charge of floating node F. Line 49, common to the sources of the floating gate transistors, is preferentially left floating HZ.

For reading READ, the different selection transistors are activated by signal SEL to a level $V_{SEL}$ and a read voltage $V_{READ}$ is applied on the control gates of the different floating gate transistors. Lines BL4 and BL5 are in a high impedance state HZ and line BL6 receives a voltage $V_{55}$ enabling supply of the read current source. Line 49 is here grounded.

The relations between the different levels $V_{PP1}$, $V_{PP2}$, $V_{SEL}$, $V_{READ}$, and $V_{55}$ are preferably as follow:

$V_{PP1}$ greater than $V_{PP2}$;

$V_{SEL}$ greater than $V_{READ}$;

$V_{READ}$ on the same order of magnitude as $V_{55}$.

What has been described hereabove in relation with an EEPROM cell as an "element of the charge retention circuit" may of course be replaced with a structure in which subsets of several identical cells are used in parallel for the different respective elements.

An electronic retention circuit may be introduced at any position of a standard EEPROM cell network, which enables making its locating by a possible malicious user more difficult.

As a variation, several circuits may be placed at different locations of an EEPROM plane. In this case, circuits all having a same discharge time or circuits having different discharge times may be provided.

According to another variation, several circuits are distributed in the memory plane but a single one is used at once, according to a determined or random sequence, controlled by an address generator. The selection transistors of the cells forming the charge retention circuit according to an embodiment are shared with normal EEPROM cells on the same bit lines, provided to provide adapted addressing and switching means.

FIGS. 10A to 10J are cross-section views along line B-B' (FIG. 9A) illustrating steps of a method for manufacturing an EEPROM cell such as that illustrated in FIGS. 9A to 9C. FIGS. 11A to 11J illustrate the results of FIGS. 10A to 10J in a cross-section view along a line C-C' (FIG. 10A).

It is started (FIGS. 10A and 11A) from a P-type doped silicon substrate 80 in which wells 81 (STI) for insulating the different cells are formed. N-type doped regions 82, corresponding to areas 24 of FIG. 2, are formed in silicon substrate 80. An oxide layer 83 is then formed above the assembly of the selection transistor and of the memory point. As an example, layer 83 may be made of silicon oxide.

At the next step, illustrated in FIGS. 10B and 11B, layer 83 has been etched to remove therefrom a portion (opening 85) at the memory point tunnel area. As an example, opening 85 may be formed by wet etch by means of an adapted mask.

At the next step, illustrated in FIGS. 10C and 11C, an insulating layer has been formed on the structure of FIGS. 10B and 11B. Thus, insulating region 86 resulting from this last layer and from layer 82 comprises a portion of lower thickness at the level of opening 85. The insulating layer of the memory point floating gate and the first insulating layer of the selection transistor are thus formed.

At the next step, illustrated in FIGS. 10D and 11D, a polysilicon layer 87 has been formed over the entire structure.

At the next step, illustrated in FIGS. 10E and 11E, polysilicon layer 87 (better illustrated in FIG. 11E) has been etched by means of an adapted mask to form openings 88 separating the EEPROM cell from other cells formed in and on substrate 80. Openings 88 are formed above insulation wells 81 (STI).

At the next step, illustrated in FIGS. 10F and 11F, an insulation layer 89 has been formed on layer 87 and on the walls and the bottom of openings 88. As an example, usually, this insulating layer may be formed of an ONO oxide-nitride-oxide stack, for example, of a first silicon oxide layer 90, of a silicon nitride layer 91, and of a second silicon oxide layer 92.

At the next step, illustrated in FIGS. 10G and 11G, an opening 94 has been formed in the ONO stack (90, 91, 92) above, partly, the memory point channel region. As an example, this opening may be obtained by two successive etchings: a dry etch to etch oxide layer 92 and nitride layer 91, then a wet etch to remove oxide layer 90. As an example, in the direction of FIG. 10G, opening 94 may have a length of approximately 0.6 µm and, in the direction of FIG. 11G, a width of approximately 0.3 µm. An insulating layer 96 has then been formed on polysilicon layer 87 at the level of opening 94. Insulating layer 96 may be obtained by oxidation of polysilicon layer 87.

At the next step, illustrated in FIGS. 10H and 11H, a polysilicon layer 98 has been formed on the structure of FIGS. 10G and 11G.

At the next step, illustrated in FIGS. 10I and 11I, the gates of the selection transistor and of the memory point have been defined. To achieve this, the assembly of polysilicon layer 98, of the ONO stack (90, 91, 92), of first polysilicon layer 87, and of insulating layer 86 is etched in adapted fashion (openings 100). N-type doped regions 102 have then been formed at the level of openings 100 in substrate 80 to form the sources and drains of the selection transistor and of the memory point.

At the next step, illustrated in FIGS. 10J and 11J, a thin insulating layer 104 has been formed above and on the sides of the selection transistor and of the memory point. Insulating layer 104 may be obtained by thermal oxidation. Spacers can then be formed, for example, by any usual method, on either side of the selection transistor and of the memory point.

As compared with a usual method for forming EEPROM cells, this method has the advantage of requiring no additional steps. Indeed, usually, when EEPROM cells are formed, low-voltage transistors are also formed on the same substrate. The low-voltage transistors are formed on and in substrate regions at the level of which polysilicon layer 87 is removed, the gate insulator and the gate of the low-voltage transistors being respectively formed of the insulating material of layer 96 and of the polysilicon of layer 98. To obtain the structure of FIGS. 9A to 9C, it is thus sufficient to modify the mask usually used to remove the ONO stack at the level of the low-voltage transistors by adding thereto an opening at the level of opening 94. Further, the structure of FIGS. 9A to 9C has the advantage of being fully compatible with the other cells in terms of programming, reading, and writing.

Figure 12:
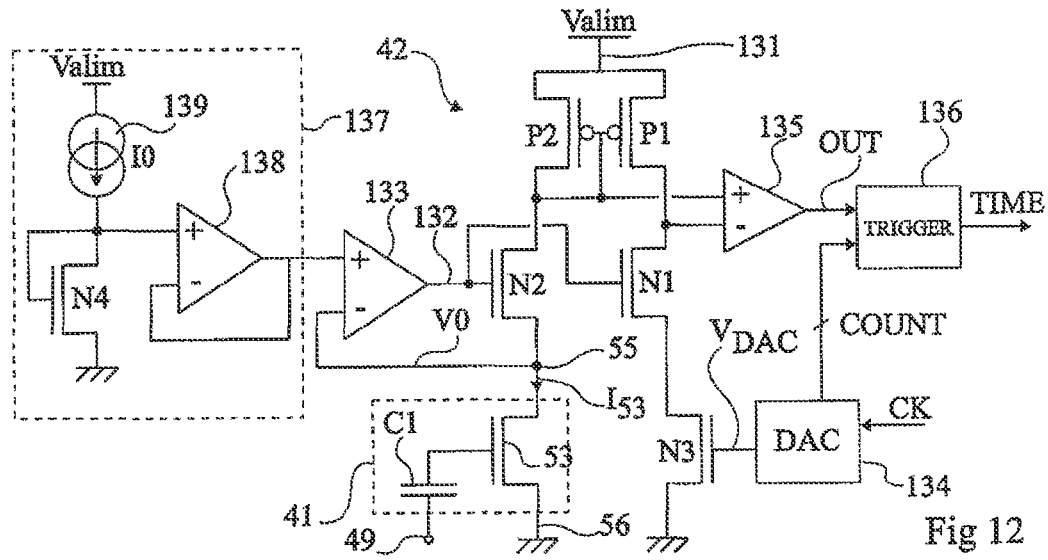
FIG. 12 shows an embodiment of a circuit for reading from a charge retention circuit.

FIG. 12 shows a first embodiment of a circuit (42, FIG. 3) for reading the state of an electronic charge retention circuit controllable for a time measurement. For simplification, the charge retention circuit (FIGS. 4 to 9C) has been symbolized by a block 41 containing the read transistor (in this example, a MOS transistor 53, FIG. 4) and a capacitive element C1.

More generally, the charge retention circuit may be formed of any circuit (for example, that described in above-mentioned International patent application WO-A-03/083769).

Output transistor 53 of circuit 41 is placed in a first branch of a differential assembly comprising two parallel branches of MOS transistors in series between a terminal 131 of application of a supply voltage Valim and the ground. Each terminal comprises, in series, a P-channel transistor P1 or P2, an N-channel transistor N1 or N2, and an N-channel transistor N3 or 53. Transistors P1 and P2 both have their gates connected to the source of transistor P2 and their drains connected to supply terminal 131. Transistors N1 and N2 have their gates connected to a terminal 132 of application of a reference voltage. This reference voltage is provided, in this example, by an operational amplifier 133 receiving, on a non-inverting input (+), a voltage V0 and having its inverting input (−) connected to the source of transistor N2 and to the drain of transistor 53 (terminal 55 of circuit 41). Optional assembly 133-N1-N2 enables setting a same voltage level on the sources of transistors N1 and N2. The gate of transistor N3 receives an analog signal $V_{DAC}$ provided by a digital-to-analog converter 134, the operation of which will be described hereafter. Its function is to provide a stepped voltage to interpret the residual charge in circuit 41.

The respective sources of transistors P2 and P1 are connected to two inputs, for example non-inverting (+) and inverting (−) of a comparator 135 with an output OUT used to trigger (TRIGGER 136) the provision of a result TIME corresponding to a binary word representative of state COUNT of a counter of the converter. This counter counts at the rate of a clock frequency CK to generate the stepped signal, as will be seen hereafter.

The circuit of FIG. 12 performs a comparison of the currents in the two branches. The output of comparator 135 switches when the current in branch P1, N1, and N3 becomes greater (or smaller according to the initial state) than the current in branch P2, N2, and 53.

If terminal 49 is grounded, for a current $I_{53}$ to flow through the first branch, quantity $Q_F/C_T$ must be greater than the threshold voltage ($V_t$) of transistor 53, where $Q_F$ represents the residual charge in circuit 41 and $C_T$ represents the capacitance between node F and the ground (capacitive element C1).

Voltage V0 imposed on terminal 55 via amplifier 133 originates, preferably, from a circuit 137 comprising a follower-assembled amplifier 138 (output connected to inverting input (−)) having its non-inverting input (+) connected to the drain of a diode-assembled N-channel transistor N4. The source of transistor N4 is grounded while its drain is connected, by a constant current source 139 (I0), to a terminal of application of a positive supply voltage (for example, Valim).

Circuit 137 generates a level V0 such that transistor 53 is conductive to enable the reading.

Current I0 is selected according to the switching desired for the circuit.

The N-channel transistors are matched for accuracy reasons.

Preferably, a level greater than level V0 is imposed on terminal 49. An aim is to obtain that, even if cell 41 is totally discharged, transistor 53 conducts, and thus to enable reading over the entire operating range. Thus, the output of comparator 135 switches when voltage $V_{DAC}$ provided by converter 134 exceeds level $V0+Q_F/C_T$.

Figure 13:
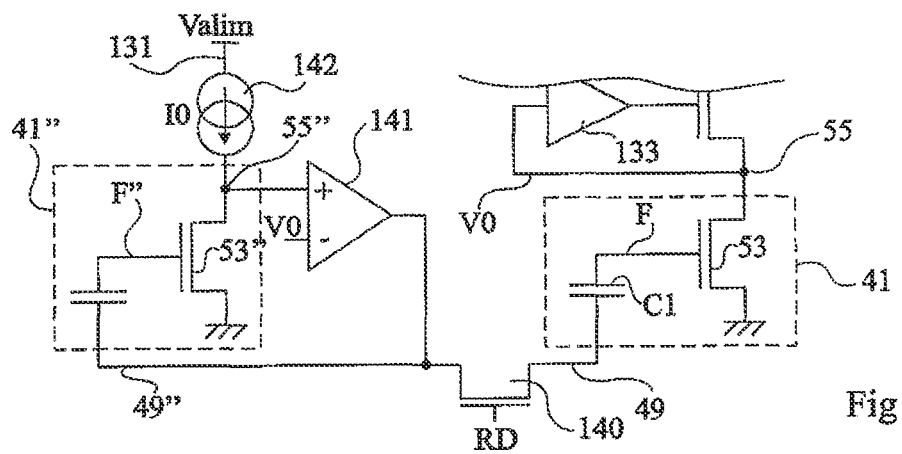
FIG. 13 partially shows another embodiment of a circuit for reading from a charge retention circuit.

FIG. 13 shows a preferred embodiment in which a reference structure 41" having its node F''' permanently discharged is used to set the voltage of terminal 49 of circuit 41. For example, a transistor 140 (pass gate) connects terminals 49 and 49" of circuits 41 and 41". An amplifier 141 has its non-inverting input (+) connected to terminal 55" of circuit 41" and, by a constant current source 142 (I0), to terminal 131 of application of the supply voltage. The inverting input (−) of amplifier 141 receives reference voltage V0 generated by a circuit 137 such as described in relation with FIG. 12. Current sources 139 and 142 generate a same current I0. Accordingly, the voltage of terminal 55" is set to V0 (imposed by the feedback of amplifier 141 and by the gate of transistor 53" which is at level V0 by the sizing of source 142). The voltage of terminal 49" is greater than level V0 even if no charge is stored at node F'''. Indeed, when a voltage is applied on terminal 49" (through amplifier 141), node F''' represents the midpoint of a capacitive divider (be it only by taking into account the gate capacitance of transistor 53" with respect to the ground). Accordingly, to obtain level V0 at node F''', the voltage of terminal 49" is greater than level V0.

To simplify the description of FIG. 13, the rest of the structure, which is identical to that discussed in relation with FIG. 12, has not been detailed. Transistor 140 is only turned on in the circuit read circuit. The rest of the time, terminal 49 is either floating, or grounded.

When transistor 140 is on, the voltage of terminal 49' is transferred onto terminal 49. Since the voltage of terminal 55 is imposed at level V0 by amplifier 133 (which has its non-inverting input connected to the output of circuit 137), the voltage of node F is at level V0 plus the charged stored on this node. If cell 41 is not charged, node F is at level V0. If the cell contains a charge $Q_F$, the voltage of node F is equal to $V0+Q_F/C_T$.

An advantage of this embodiment where transistor 140 imposes the same voltage on all the accessible second electrodes of the capacitive elements of circuits 41 and 41' is to compensate for possible manufacturing dispersions.

The read circuit of FIG. 12 or of FIG. 13 may be turned off by means of adapted control switches (for example, disconnecting the power supply branches and/or turning off the current sources) outside read periods.

On the read side, assuming that charge $Q_F$ has an initial value $(\ )_{NF}$ here noted as Q(r), a stepped voltage $V_{DAC}$ provided by converter 134 ranging between, V0 and V0+Q (r)/$C_T$ enables measuring time.

Starting from a level $V0+Q(r)/C_T$ and progressively decreasing the level, the switching point of comparator 135 corresponds to a digital reference COUNT of the converter. This reference value provides information about the time elapsed since the reset (programming of charge retention circuit 41) to level Q(r). Examples will be given in relation with FIGS. 15A to 18B.

An advantage is that the provision of a digital word is easily exploitable.

Preferably, the digital-to-analog converter is a non-linear converter to compensate for the non-linear shape of the capacitive discharge of the charge retention circuit. As a variation, the correction is performed downstream by digital means (of calculator type) correcting the elapsed time according to count COUNT at which the read circuit switches.

Figure 14:
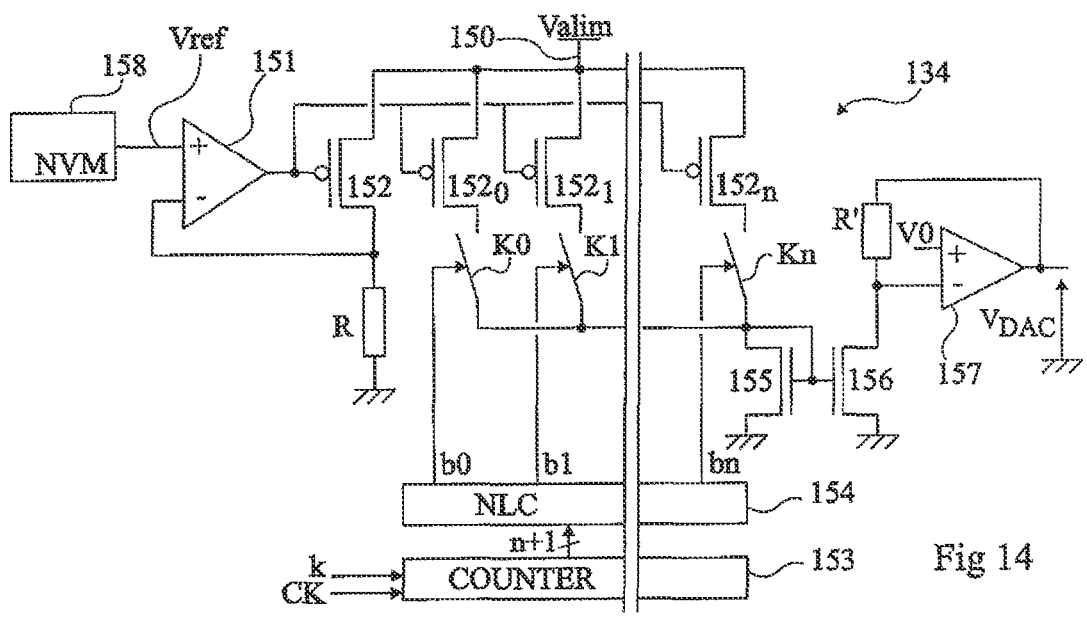
FIG. 14 shows an example of a non-linear digital-to-analog converter usable in a circuit for reading from a charge retention circuit.

FIG. 14 shows an example of an electric diagram of a digital-to-analog converter 134. A reference voltage Vref is provided on a differential amplifier 151 having its output connected to the common gates of n+2 branches comprising a P-channel MOS transistor 152, $152_0$, $152_1$, ..., $152_n$. A first transistor 152 has its source grounded by a resistor R and connected to the inverting input (−) of amplifier 151 to set a current Vref/R. Transistors $152_0$ to $152_n$ of the n+1 next branches $152_0$ to $152_n$ are of increasing size from one branch to the next one, starting from the unity size of transistor $152_0$, equal to that of transistor 152. The size ratio is preferably double from one branch to the next one to reproduce the binary character of the counting on the voltage amplitudes. The respective drains of transistors 152 and $152_0$ to $152_n$ are connected to a terminal 150 of application of a supply voltage Valim. The respective sources of transistors $152_0$ to $152_n$ are connected, by switches $K_0$ to $K_n$, to the drain of an N-channel MOS transistor 155 assembled as a diode and as a current mirror on a second N-channel transistor 156. The sources of transistors 155 and 156 are grounded. The drain of transistor 156 is connected to an inverting input (−) of an operational amplifier 157 having its non-inverting input (+) receiving reference voltage V0 of the read circuit and having its output providing voltage $V_{DAC}$. A resistor R' (for example, of same value as resistor R) connects the output of amplifier 157 to its inverting input. Switches $K_0$ to $K_n$ (for example, MOS transistors) are controlled by the resistive bits b0, b1, ..., bn of a circuit for counting over n+1 bits. The counting circuit comprises a counter 153 having n+1 bits sent in parallel on a non-linear conversion circuit 154 (NLC). Amplifiers 151 and 157, as well as counter 153 and circuit 154, are supplied, for example, with voltage Valim.

Assuming that resistors R and R' have same values, the current in transistor 156 is equal to k*Vref/R, where k represents state COUNT of the counting circuit. Output voltage $V_{DAC}$ is then provided by relation V0+k*Vref.

Other non-linear digital-to-analog conversion circuits may be used, the circuit of FIG. 14 showing a simple example of embodiment of such a converter.

Figures 15A, 15B:
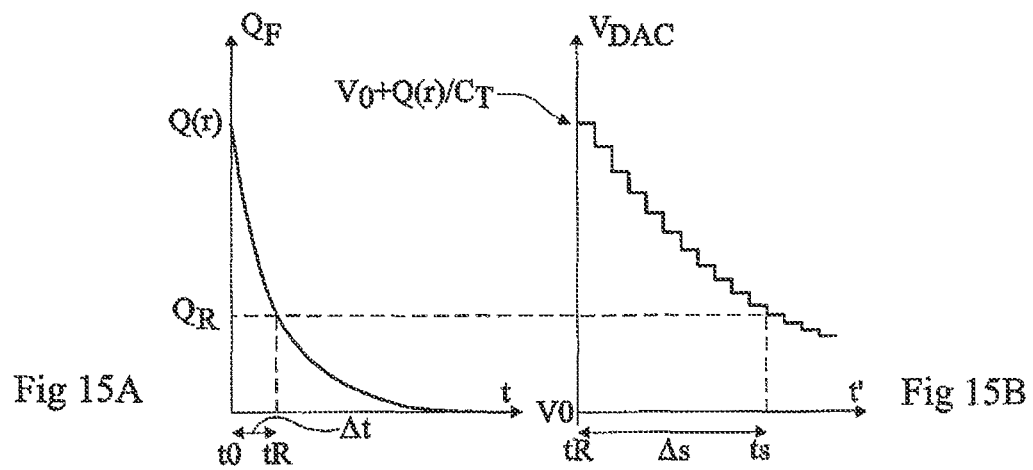
FIGS. 15A and 15B are timing diagrams illustrating an operating mode of a read circuit of a charge retention circuit.

FIGS. 15A and 15B illustrate a first operating mode of a read circuit and respectively show examples of shapes of the variation of charge $Q_F$ and of voltage $V_{DAC}$ along time.

A setting of the discharge circuit to a level Q(r) at a time t0 and a reading at a time tR when the residual charge is $Q_R$ are assumed.

The non-linearity of the converter is defined by circuit 154 to compensate for the charge retention circuit discharge curve, for example, based on experimental or characterization data. Circuit 154 is, for example, a combinatory logic converting a linear growth of the output of counter 153 into a non-linear growth.

According to the time at which the reading is performed (for example, tR, FIG. 15A), the current in transistor 53 generates a switching of output OUT with a delay Δs with respect to the beginning time of the reading (time origin of the timing diagram of FIG. 15B). This time interval actually corresponds to a number provided by counter 153 in the generation of the stepped voltage sent onto the gate of transistor N3 (FIG. 12). The counter state at the time when signal OUT switches enables deducing the elapsed time interval Δt between programming time t0 and read time tR, whether or not the device containing the charge retention circuit has been powered (provided that its terminal 52 has remained floating or isolated). In the example of FIGS. 15A and 15B, a voltage $V_{DAC}$ decreasing from level V0+Q(r)/$C_T$ has been assumed. A measurement with an increasing voltage is of course possible, switching point ts remaining the same.

The rate of the steps of voltage $V_{DAC}$ (and thus frequency CK of counter 153) is selected to be fast enough with respect to the discharge rate of circuit 41 for interval Δs between the read beginning time tR and switching time ts to be negligible with respect to the real interval Δt (tR−t0). The exaggeration of the representation of the drawings however shows the opposite.

It can thus be seen that element 41 can be discharged with no power supply, without for all this to lose the time notion.

Voltage Vref is, preferably, selected to comply with equation k*Vref=Q(r)/$C_T$.

Preferably, an adjustment of the read circuit is performed by storing, in a non-volatile memory register (NVM) 158, a voltage value Vref or starting number k of the counter, and by using this value for each reading.

Figures 16A, 16B:
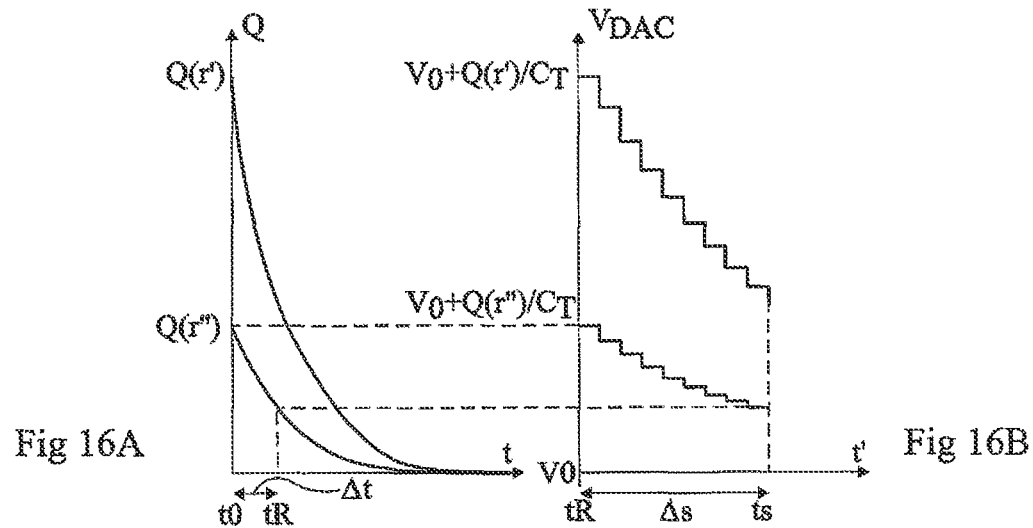
FIGS. 16A and 16B are timing diagrams illustrating a variation of an operating mode of a circuit for reading from a charge retention circuit.

FIGS. 16A and 16B show, in two initial charge states Q(r') and Q(r"), examples of the charge decrease along time and of the possible adjustment performed with the non-linear digital-to-analog converter.

The fact of adjusting the reference value (for example, respectively to values Q(r')/(k*$C_T$) and Q(r")/(k*$C_T$)) makes the time measurement independent from programming conditions, that is, from initial load Q(r') or Q(r"). As can be seen in FIGS. 16A and 16B, switching time ts is the same while the starting levels of the converter are different by being adapted to the initial charge levels.

According to whether the discharge curve is known or not, it may be necessary to calibrate each discharge circuit 41 so that the non-linearity of converter 134 follows the discharge curve.

FIGS. 17A, 17B, 18A, and 18B illustrate a preferred embodiment of the present invention in which a calibration of the read circuit is performed in a first use, in a setting or at the end of the manufacturing. To achieve this, the circuit is programmed at a time t10, then measured at a time t11 distant by a known interval from time t10 (for example, a 24-hour interval). The number of steps of the stepped decrease provided by the digital-to-analog converter until switching time ts is then determined. This enables defining, for the concerned circuit, the number of steps for the known time interval. This number can then be stored in a non-volatile storage element of device 40.

Figures 17A, 17B:
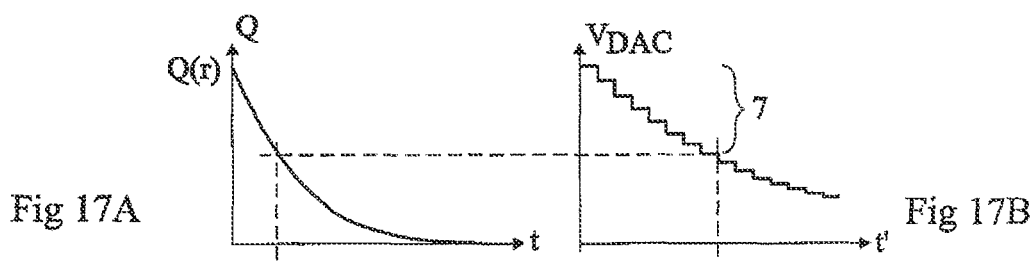
FIGS. 17A and 17B are timing diagrams illustrating an embodiment of a circuit for characterizing a read circuit.

FIGS. 17A and 17B illustrate a first example in which 7 steps are required for 24 hrs. The time interval (TIME STEP) between two steps then is 24/7.

Figures 18A, 18B:
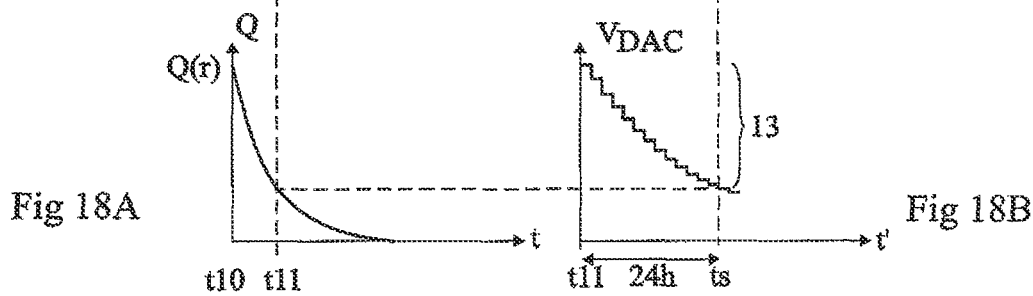
FIGS. 18A and 18B are timing diagrams illustrating another embodiment of a circuit for characterizing a read circuit.

FIGS. 18A and 18B illustrate a second example in which 13 steps are necessary to define a same time range by means of another circuit differing, for example, by the value of capacitance C1. The time interval between two steps then is 24/13.

Figure 19:
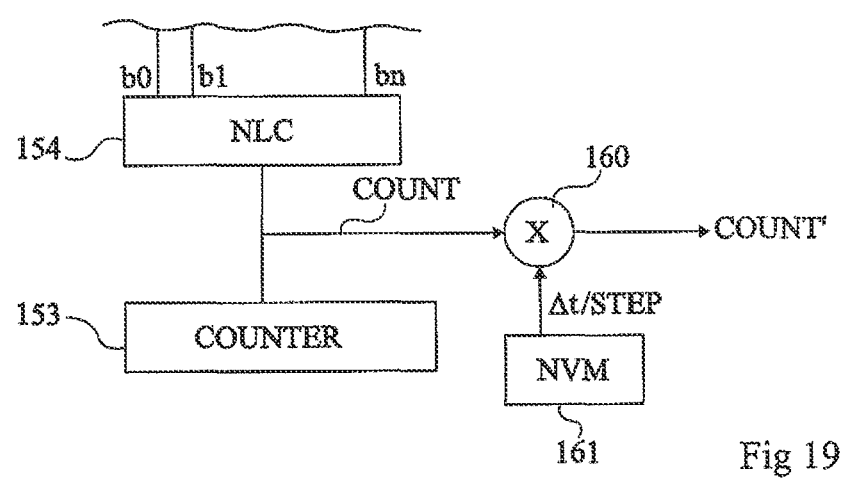
FIG. 19 partially and schematically shows a variation of the read circuit compatible with the characterization method of FIGS. 17A, 17B, 18A, and 18B.

FIG. 19 partially shows in the form of blocks an example of a possible adaptation of the circuit of FIG. 14 to obtain the operation of FIGS. 17A, 17B, 18A, and 18B. This modification comprises using count COUNT provided by counter 153 to multiply it (multiplier 160) with a time conversion parameter (Δt/STEP) stored in a non-volatile memory (block 161, NVM), to provide a modified counting value COUNT' taking into account the circuit characteristics. Value COUNT' is provided to trigger 136. This amounts to applying a weighting coefficient which is a function of an initial circuit characterization measurement.

An advantage of this embodiment is that it requires no structural modification of the read circuit to adapt to different charge retention circuits.

An embodiment finds many applications in any system where a time is desired to be measured on a powered-off circuit. A specific example of application relates to the management of rights of access to data or programs stored on digital supports. In such an application, a circuit according to an embodiment may be added to the non-permanently powered storage circuit (memory key or the like) or be in a separate circuit and be reset, for example, on first loading of the data to be protected.

A second example of application relates to the measuring of time intervals between any two events, for example, in transaction-type applications.

Of course, the present invention is likely to have various alterations, modifications, and improvements which will readily occur to those skilled in the art. In particular, the practical implementation of the circuit according to the present invention based on the functional indications given hereabove and on the needs of the applications raises no difficulty. For example, especially since it requires no permanent power supply, embodiments of the present invention can be implemented in contactless devices (of electromagnetic transponder type) which draw their power supply from an electromagnetic field in which they are located (generated by a terminal).

What is claimed is:

1. An electronic charge retention circuit for time measurement, comprising:
 a first subset of EEPROM memory cells in an array of EEPROM memory cells formed in a substrate, each EEPROM memory cell including a selection transistor and a dual-gate transistor, wherein each dual-gate transistor of the first subset includes a source region and a drain region formed in the substrate, and further includes a gate stack formed over a channel region of the substrate between the source and drain regions, the gate stack including a control gate, a floating gate, and an insulating layer separating the control gate and the floating gate, the insulating layer including a first portion extending from the control gate to the floating gate and a second portion extending from the control gate to the floating gate with the second portion of the insulating layer being less insulating than the first portion; and
 a second subset of EEPROM memory cells in the array of EEPROM memory cells, each EEPROM memory cell of the second subset including a selection transistor and a dual-gate transistor, wherein each dual-gate transistor of the second subset includes a source region and a drain region formed in the substrate, and further includes a gate stack formed over a channel region of the substrate between the source and drain regions, the gate stacking including a control gate, a floating gate, and an insulating layer separating the control gate and floating gate, wherein the floating gates of the dual-gate transistors of the first and second subsets of EEPROM memory cells are coupled to a floating node.

2. The electronic charge retention circuit of claim 1 further comprising a third subset of EEPROM memory cells, each EEPROM memory cell of the third subset including a selection transistor and a dual-gate transistor, wherein each dual-gate transistor of the third subset includes a source region and a drain region formed in the substrate, and a gate stack formed over a channel region in the substrate between the source and drain regions, the gate stack including a control gate, a floating gate, and an insulating layer separating the control gate and the floating gate, wherein the floating gate of the dual-gate transistor of each memory cell of the third subset is coupled to the floating node and the third subset of EEPROM memory cells are configured to inject charges to the floating node or extract charges from the floating node.

3. The electronic charge retention circuit of claim 1, wherein the first portion of the insulating layer is formed of a stack of a first silicon oxide layer, a silicon nitride layer, and a second silicon oxide layer, and wherein the second portion of the insulating layer is formed of a third silicon oxide layer.

4. The electronic charge retention circuit of claim 1, wherein each of the source and drain regions has a first conductivity type and the substrate has a second conductivity type.

5. The electronic charge retention circuit of claim 4, wherein each of the dual-gate transistors of the first subset includes a tunnel window formed over the channel region and further includes a first doped region formed in the substrate and having a first portion extending into the channel region and a second portion extending into the source region, the first doped region having a first depth into the substrate and the source and drain regions having a second depth into the substrate, the first depth being less than the second depth, and wherein the second portion of the insulating layer overlaps only the first doped region.

6. The electronic charge retention circuit of claim 1, wherein the second portion of the dual-gate transistor of each EEPROM memory cell of the first subset of EEPROM memory cells has dimensions selected to provide a predetermined discharge rate of the floating gate of the dual-gate transistor.

7. An electronic device, comprising: a charge retention circuit including, a first EEPROM memory cell including a selection transistor coupled in series with a dual-gate transistor, each dual-gate transistor including a source region and a drain region formed in a semiconductor substrate and a channel region in the semiconductor substrate between the source and drain regions, the dual-gate transistor further including a first doped region extending from the source region into the channel and a second doped region extending from the drain region into the channel, and the dual-gate transistor further including a gate stack having a control gate and a floating gate separated by an insulating layer, the insulating layer including a first portion contacting the control gate and extending to the floating gate, the first portion also extending at least partially over the first doped region, and the insulating layer including a second portion contacting the control gate and extending to floating gate, the second portion also extending at least partially over the channel region, wherein the second portion of the insulating layer is less insulating than the first portion of the insulating layer; and a second EEPROM memory cell including a selection transistor coupled in series with a dual-gate transistor, the dual-gate transistor of the second EEPROM memory cell having a floating gate and a control gate, and the floating gates of the dual-gate transistors of the first and second EEPROM memory cells being coupled to a floating node; and a time measurement circuit coupled to the charge retention circuit, the time measurement circuit configured to transform information of a residual charge on the floating node into a time interval between an initialization time of a retention phase and a measurement time based on a current through the dual-gate transistor of the second EEPROM memory cell.

8. The electronic device of claim 7, wherein the time measurement circuit comprises a differential circuit including first and second branches, each of the first and second branches including a plurality of transistors coupled in series and the first branch including the dual-gate transistor of the second EEPROM memory cell as one of the transistors coupled in series.

9. The electronic device of 8 further comprising a third EEPROM memory cell, the floating gate of the dual-gate transistor of the third EEPROM memory cell connected to the floating node and the third EEPROM memory cell configured to inject or extract charges to or from the floating node in a programming or reset phase of operation.

10. The electronic device of claim 7, wherein the first portion of the insulating layer is formed of a stack of a first silicon oxide layer, of a silicon nitride layer, and of a second silicon oxide layer, the second portion of the insulating layer being formed of a third silicon oxide layer.

11. The electronic device of claim 7, wherein the source and drain regions have a first conductivity type and the semiconductor substrate has a second conductivity type.

12. The electronic device of claim 11, wherein the first doped region has a first depth into the semiconductor substrate and the source and drain regions have a second depth into the semiconductor substrate, the first depth being less than the second depth, and the first portion overlapping only the first doped region.

13. The electronic device of claim 7, wherein the first portion has dimensions that provide a predetermined discharge rate of the charge on the floating gate of the dual-gate transistor to define the time interval based on the residual charge.

14. An electronic circuit, comprising:
a first subset of floating gate memory cells in an array of memory cells formed in a substrate, each floating gate memory cell including a selection transistor and a dual-gate transistor, wherein each dual-gate transistor of the first subset includes a gate stack having a control gate, a floating gate, and an insulating layer separating the control gate and the floating gate, the insulating layer including first and second portions with the first portion forming a more insulating electrical path between the control and floating gates than an insulating electrical path formed by the second portion between the control and floating gates;
a second subset of floating gate memory cells in the array of memory cells, each floating gate memory cell of the second subset including a selection transistor and a dual-gate transistor, wherein each dual-gate transistor of the second subset includes a gate stack having a control gate, a floating gate, and an insulating layer separating the control gate and floating gate, wherein the floating gates of the dual-gate transistors of the first and second subsets of memory cells are coupled to a floating node; and
a third subset of floating gate memory cells, each floating gate memory cell of the third subset including a selection transistor and a dual-gate transistor, wherein each dual-gate transistor of the third subset includes a gate stack having a control gate, a floating gate, and an insulating layer separating the control gate and the floating gate, wherein the floating gate of the dual-gate transistor of each memory cell of the third subset is coupled to the floating node.

15. The electronic circuit of claim 14, wherein each floating gate memory cell comprises an EEPROM memory cell.

16. The electronic circuit of claim 14, wherein the dual-gate transistor of each floating gate memory cell of the first subset of floating gate memory cells includes the first portion of the insulating layer comprising an oxide-nitride-oxide stack.

17. The electronic circuit of claim 14, wherein the second portion of the dual-gate transistor of each floating gate memory cell of the first subset of floating gate memory cells is configured to provide a predetermined discharge rate of the floating gate of the dual-gate transistor.

18. The electronic circuit of claim 14, wherein the floating gate of each dual-gate transistor of the floating gate memory cells of the third subset is configured to inject or extract charges on the floating node.

19. The electronic circuit of claim 18, wherein the electronic circuit is further configured to generate a measurement of time based upon a residual charge on the floating node, the residual charge being based on a current in the dual-gate transistor of the floating gate memory cell of the second subset.

\* \* \* \* \*

UNITED STATES PATENT AND TRADEMARK OFFICE
CERTIFICATE OF CORRECTION

Page 1 of 1

PATENT NO. : 9,874,856 B2
APPLICATION NO. : 14/883364
DATED : January 23, 2018
INVENTOR(S) : Pascal Fornara It is certified that error appears in the above-identified patent and that said Letters Patent is hereby corrected as shown below:

In the Claims

Column 16, Line 11:
"9. The electronic device of 8 further comprising a third"
Should read:
--9. The electronic device of claim 7 further comprising a third--.

Signed and Sealed this
Eighth Day of October, 2019

Andrei Iancu
*Director of the United States Patent and Trademark Office*